(12) United States Patent
Wehner et al.

(10) Patent No.: US 11,725,749 B2
(45) Date of Patent: Aug. 15, 2023

(54) PASSIVE MICROFLUIDIC VALVES

(71) Applicant: THE REGENTS OF THE UNIVERSITY OF CALIFORNIA, Oakland, CA (US)

(72) Inventors: Michael Wehner, Santa Cruz, CA (US); Keng-Yu Lin, Santa Cruz, CA (US); Natalie King, Santa Cruz, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 88 days.

(21) Appl. No.: 17/515,792

(22) Filed: Nov. 1, 2021

(65) Prior Publication Data

US 2022/0136618 A1 May 5, 2022

Related U.S. Application Data

(60) Provisional application No. 63/108,606, filed on Nov. 2, 2020.

(51) Int. Cl.
*F16K 99/00* (2006.01)

(52) U.S. Cl.
CPC ...... *F16K 99/0015* (2013.01); *F16K 99/0057* (2013.01); *B81B 2201/038* (2013.01); *B81B 2201/054* (2013.01); *F16K 99/0025* (2013.01); *F16K 2099/0069* (2013.01); *F16K 2099/0082* (2013.01)

(58) Field of Classification Search
CPC ............. F16K 99/0015; F16K 99/0025; F16K 99/0057; F16K 2099/0082; F16K 2099/0069; B81B 2201/038; B81B 2201/054; F02B 75/34
USPC ........... 251/61.1, 331; 137/315.05, 500, 510, 137/859, 505.36
See application file for complete search history.

(56) References Cited

U.S. PATENT DOCUMENTS

| | | | | |
|---|---|---|---|---|
| 4,848,722 A | * | 7/1989 | Webster | F16K 7/17 137/884 |
| 5,725,017 A | * | 3/1998 | Elsberry | A61M 5/14276 137/517 |
| 6,123,316 A | * | 9/2000 | Biegelsen | F16K 99/0051 251/129.01 |
| 6,158,712 A | * | 12/2000 | Craig | G01N 30/32 251/61.1 |
| 6,406,605 B1 | * | 6/2002 | Moles | F16K 99/0015 204/600 |

(Continued)

*Primary Examiner* — Minh Q Le
(74) *Attorney, Agent, or Firm* — Carter, DeLuca & Farrell LLP

(57) ABSTRACT

A passive microfluidic valve includes a first manifold portion having a first chamber; a first inlet fluidly coupled to the first chamber; and a second inlet. The valve also includes a second manifold portion in fluid communication with the first chamber via a channel. The second manifold portion includes a second chamber fluidly coupled to the first chamber and the second inlet. The valve further includes a flexible membrane disposed between the first manifold portion and the second manifold portion and separating the first chamber and the second chamber, the flexible membrane configured to modulate a flow rate of a media flowing between the first inlet and the second inlet in either direction in response to pressure of the media flow.

19 Claims, 6 Drawing Sheets

(56) References Cited

U.S. PATENT DOCUMENTS

| | | | | |
|---|---|---|---|---|
| 6,412,751 | B1* | 7/2002 | Wang | F16K 99/0059 |
| | | | | 251/61 |
| 8,539,981 | B2* | 9/2013 | Chappel | A61M 37/00 |
| | | | | 604/288.04 |
| 9,971,358 | B2* | 5/2018 | Chappel | G05D 7/0113 |
| 10,962,124 | B1* | 3/2021 | Stanley | F16K 7/123 |
| 2003/0146401 | A1* | 8/2003 | Wetzel | F16K 99/0059 |
| | | | | 251/61.1 |
| 2011/0150702 | A1* | 6/2011 | Kim | F16K 99/0015 |
| | | | | 156/60 |
| 2011/0274566 | A1* | 11/2011 | Amirouche | F04B 53/10 |
| | | | | 417/322 |
| 2011/0315227 | A1* | 12/2011 | Shu | B01L 9/527 |
| | | | | 137/1 |
| 2012/0181460 | A1* | 7/2012 | Eberhart | F16K 99/0059 |
| | | | | 251/61.1 |
| 2013/0032235 | A1* | 2/2013 | Johnstone | F04B 43/02 |
| | | | | 137/511 |
| 2014/0227147 | A1* | 8/2014 | Beyer | B81C 1/00119 |
| | | | | 422/502 |
| 2015/0021501 | A1* | 1/2015 | Ono | F16K 99/0059 |
| | | | | 251/61 |
| 2015/0096638 | A1* | 4/2015 | Kodama | F16K 15/145 |
| | | | | 137/859 |
| 2015/0352549 | A1* | 12/2015 | Kolb | B29C 65/16 |
| | | | | 422/539 |
| 2019/0219194 | A1* | 7/2019 | Lu | F16K 99/0059 |
| 2021/0041280 | A1* | 2/2021 | Wald | F16K 99/0048 |
| 2021/0088155 | A1* | 3/2021 | Lu | F16K 99/0034 |
| 2022/0082181 | A1* | 3/2022 | Leistner | F16K 99/0015 |

* cited by examiner

PASSIVE MICROFLUIDIC VALVES

CROSS-REFERENCE TO RELATED APPLICATION

The present application claims the benefit of and priority to U.S. Provisional Application No. 63/108,606, filed on Nov. 2, 2020. The entire disclosure of the foregoing application is incorporated by reference herein.

GOVERNMENT LICENSE RIGHTS

This invention was made with Government support under Grant No. PO35227, awarded by The Defense Advanced Research Projects Agency. The Government has certain rights in the invention.

BACKGROUND

Polymer combustion micro-engines have been previously developed; however, these engines require connection to external controls. In particular, such engines have been controlled either manually or using active valves that are individually programmed to open and close at predetermined times. These auxiliary systems are far larger and heavier than the micro-engines themselves, which minimizes their usefulness.

Valves are used to control media (e.g., liquid or gas) flow through tubes feeding micro-engines and other micro-scale devices. Conventional valves are controlled via electrical or pneumatic stimulation and are orders of magnitude larger than the microfluidic lines, which may have cross-sections that are from tens to thousands of microns. Although microfluidic valves exist, they are largely controlled via external pressure sources. Passive microfluidic valves are largely check-valves, allowing flow only in one direction but blocking flow in the other. Thus, there is a need for passive micro-valves at the millimeter scale capable of controlling liquid and/or gas flow.

SUMMARY

Valves according to the present disclosure allow, modulate, or block flow based on predetermined system parameters such as flow rate or pressure difference. In addition, the valves are configured to either allow or block flow in the reverse direction. This novel mode of actuation allows for controlling combustion reactions at small (e.g., millimeter) scale.

The present disclosure provides valves having passive components that modulate the flow of liquids and gasses through channels. Valves include a plurality of channels, membranes, and openings configured to allow or block flow in one or both directions based on flow properties, such as flowrate and pressure state within the system. Valves may be fabricated from any suitable material, such as thermoplastics, metals, elastomers and may be fabricated using any of a number of methods, including soft additive manufacturing, lithography, molding, manual processing, and plasma bonding.

Valves according to the present disclosure may be used to perform various functions in small form factor devices, e.g., millimeter scale, with little or no logic control. In one embodiment, the valves may be used as part of a control system for an internal combustion micro-engine. Additional applications for these valves include regulating, blocking, and timing the delivery of liquid and gas fuels from a fuel reservoir to a combustion chamber and sealing an exhaust port during a combustion event, then re-opening the port after combustion to allow release of exhaust gasses. The valves may be used as bidirectional valves with two-way valving to allow selective flow in both directions, namely, sealing and/or venting exhaust in one direction, and allowing ambient air or oxygen to flow in the opposite direction, bringing air into the combustion chamber. The valves may also be used control and regulate flow in other parts of the system.

A valve according to the present disclosure may be fabricated using soft lithography techniques by initially preparing a photolithography mask, and then generating a wafer-based mold. The valve may be formed from polydimethylsiloxane or any other suitable polymer. Liquid prepolymer may be placed in molds to form portions of the valve's manifold. A membrane, which is disposed between the portions of the manifold may be formed by spin-coating until a desired thickness is reached. Once all of the components of the valve are fabricated, the components may be aligned and bonded using plasma bonding or any other technique (e.g., using adhesives) to secure the components to each other. Fabrication is completed by forming openings through the membrane and channels within the portions of the manifold.

According to one embodiment of the present disclosure, a passive microfluidic valve is disclosed. The valve includes a first manifold portion having a first chamber; a first inlet fluidly coupled to the first chamber; and a second inlet. The valve also includes a second manifold portion in fluid communication with the first chamber via a channel. The second manifold portion includes a second chamber fluidly coupled to the first chamber and the second inlet. The valve further includes a flexible membrane disposed between the first manifold portion and the second manifold portion and separating the first chamber and the second chamber. The flexible membrane is configured to modulate a flow rate of a media flow flowing between the first inlet and the second inlet in either direction in response to pressure of the media flow.

According to one aspect of the above embodiment, the flexible membrane includes a deflection portion separating the first chamber and the second chamber. The deflection portion is configured to limit the flow rate of the media flow in a first direction, in which the media flows from the first inlet to the second inlet, in response to pressure of the media flow. The deflection portion is further configured to deflect toward an inner surface of the second chamber while the media flow is in the first direction and partially occluding the second chamber. The deflection portion is further configured to at least one of limit the flow rate of the media or block flow of the media in a second direction, in which the media flows from the second inlet to the first inlet, in response to pressure of the media flow. The deflection portion is further configured to deflect toward an inner surface of the first chamber while the media flow is in the second direction and at least one of partially occluding the second chamber or blocking the first inlet.

According to another aspect of the above embodiment, each of the first manifold portion, the second manifold portion, and the flexible membrane is formed from an elastomer. Each of the first manifold portion, the second manifold portion, and the flexible membrane is formed from polydimethylsiloxane.

According to a further aspect of the above embodiment, each of the first chamber and the second chamber may have a substantially cylindrical shape having a diameter from about 3 mm to about 10 mm. Each of the first inlet and the second inlet may have a circular cross-section having a diameter from about 0.5 mm to about 2 mm.

According to another embodiment of the present disclosure, a passive microfluidic valve is disclosed. The valve includes a first manifold portion having a first chamber; a first inlet fluidly coupled to the first chamber; and a second inlet. The valve also includes a second manifold portion in fluid communication with the first chamber via a channel. The second manifold portion includes a second chamber fluidly coupled to the first chamber and the second inlet. The valve further includes a flexible membrane disposed between the first manifold portion and the second manifold portion. The flexible membrane separates the first chamber and the second chamber. The flexible membrane is configured to limit a flow rate of a media flow in a first direction, in which media flows from the first inlet to the second inlet, in response to pressure of the media flow. The flexible membrane is also configured to limit the flow rate and/or block flow of the media in a second direction, in which the media flows from the second inlet to the first inlet, in response to pressure of the media flow.

According to one aspect of the above embodiment, the flexible membrane includes a deflection portion separating the first chamber and the second chamber. The deflection portion is configured to deflect toward an inner surface of the second chamber while the media flow is in the first direction and partially occluding the second chamber. The deflection portion is further configured to deflect toward an inner surface of the first chamber while the media flow is in the second direction and at least one of partially occluding the second chamber or blocking the first inlet.

According to another aspect of the above embodiment, each of the first manifold portion, the second manifold portion, and the flexible membrane is formed from an elastomer. Each of the first manifold portion, the second manifold portion, and the flexible membrane is formed from polydimethylsiloxane.

According to a further aspect of the above embodiment, each of the first chamber and the second chamber may have a substantially cylindrical shape having a diameter from about 3 mm to about 10 mm. Each of the first inlet and the second inlet may have a circular cross-section having a diameter from about 0.5 mm to about 2 mm.

According to another aspect of the present disclosure, a micro-engine configured to combust fuel is disclosed. The micro-engine is coupled to the passive microfluidic valve according to any of the above embodiments. The passive microfluidic valve is configured to pass air in the first direction to the micro-engine and to pass exhaust in the second direction from the micro-engine.

BRIEF DESCRIPTION OF DRAWINGS

Various embodiments of the present disclosure will be described herein below with reference to the figures, in which like reference numerals designate identical or corresponding elements in each of the several views, wherein.

DETAILED DESCRIPTION

Figure 1:
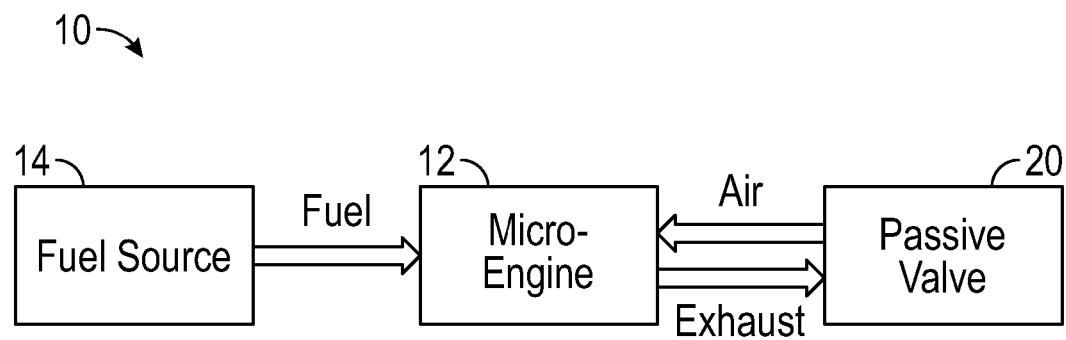
FIG. 1 is a schematic diagram of an internal combustion micro-engine coupled to one or more passive microfluidic valves according to one embodiment of the present disclosure.

The disclosed passive microfluidic valves are described in detail with reference to the drawings in which like reference numerals designate identical or corresponding elements in each of the several views. However, it is to be understood that the aspects of the disclosure described herein are merely exemplary of the disclosure and may be embodied in various forms. Well-known functions or constructions are not described in detail to avoid obscuring the disclosure in unnecessary detail. Therefore, specific structural and functional details disclosed herein are not to be interpreted as limiting, but merely as a basis for the claims and as a representative basis for teaching one skilled in the art to variously employ the disclosure in virtually any appropriately detailed structure.

With reference to FIG. 1, an exemplary embodiment of an internal combustion micro-engine system 10 includes a micro-engine 12 coupled to a fuel source 14 and one or more passive microfluidic valves (hereinafter "valve") 20 according to the present disclosure. The fuel source 14 may provide any suitable fuel in liquid or gaseous form, such as hydrocarbons, hydrogen, and the like, to the micro-engine 12 for combustion therein. The valve 20 is configured to control exhaust flow from the micro-engine 12 and intake flow of air or oxygen to the micro-engine 12 to allow for the combustion reaction to occur.

Figure 2:
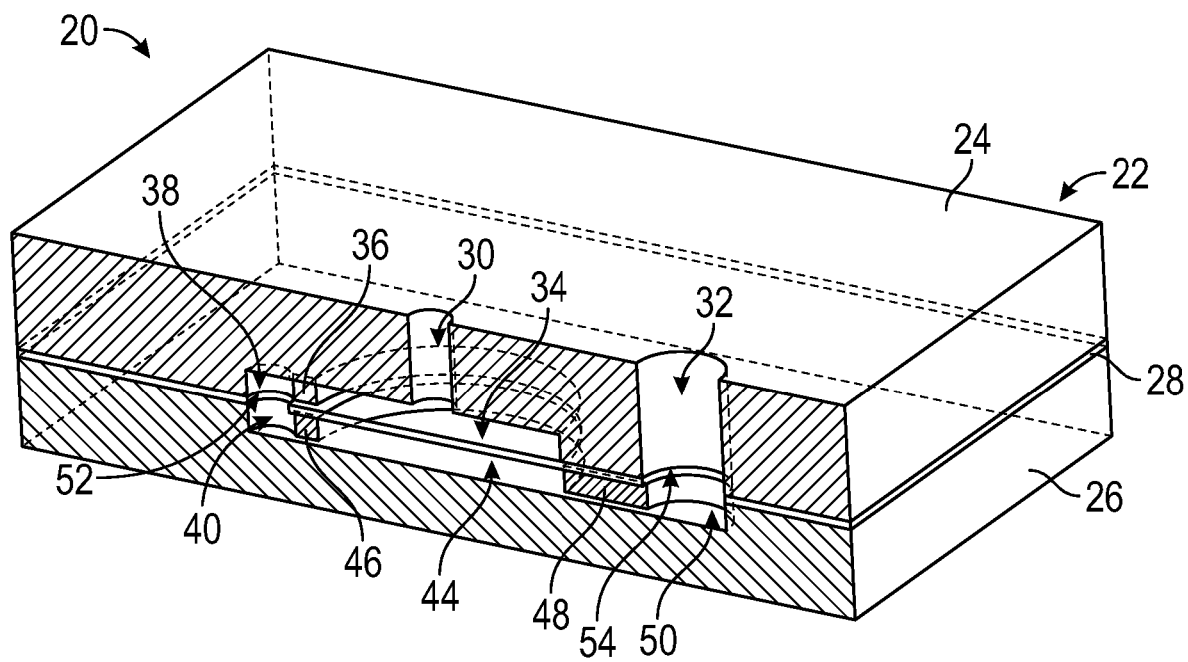
FIG. 2 is a perspective, cross-sectional view of a passive microfluidic valve in a neutral state according to one embodiment of the present disclosure.

With reference to FIG. 2, the valve 20 includes a manifold 22 having a first manifold portion 24 and a second manifold portion 26, which are separated by a flexible membrane 28. The second manifold portion 26 and the first manifold portion 24 may have the same dimensions. In embodiments, the second manifold portion 26 and the first manifold portion 24 may have different heights and other dimensions. The length may be from 5 mm to about 20 mm, the width may be from about 5 mm to about 10 mm, and the height may be from about 1 mm to about 5 mm.

The first manifold portion 24 includes a pair of inlets 30 and 32, extending along the height of the first manifold portion 24. The inlet 30 is fluidly coupled to a first chamber 34 defined in the first manifold portion 24, which is also interconnected via a passage 36 to a channel 38, both of which are also defined in the first manifold portion 24. As used herein, the term "fluidly coupled" denotes communication between chambers, lumens, channels, or any passage through which liquid or gas media may flow. The term "fluidly coupled" is used interchangeably with other terms, such as "interconnected" and "connected", etc.

The chamber 34 may have a substantially cylindrical shape and may have a diameter from about 3 mm to about 10 mm. The passage 36 may be of any suitable cross-sectional shape having a height from about 0.1 mm to about 1 mm, width from about 0.5 mm to about 2 mm, and any suitable length.

Figure 3A:
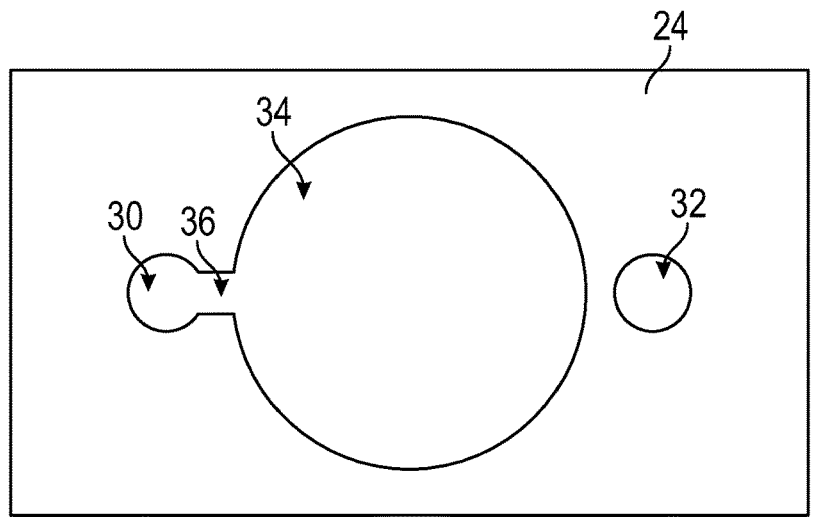
FIG. 3A-C are plan views of a cover manifold of the passive microfluidic valve of FIG. 2 according to according to one embodiment of the present disclosure.
Figure 3B:
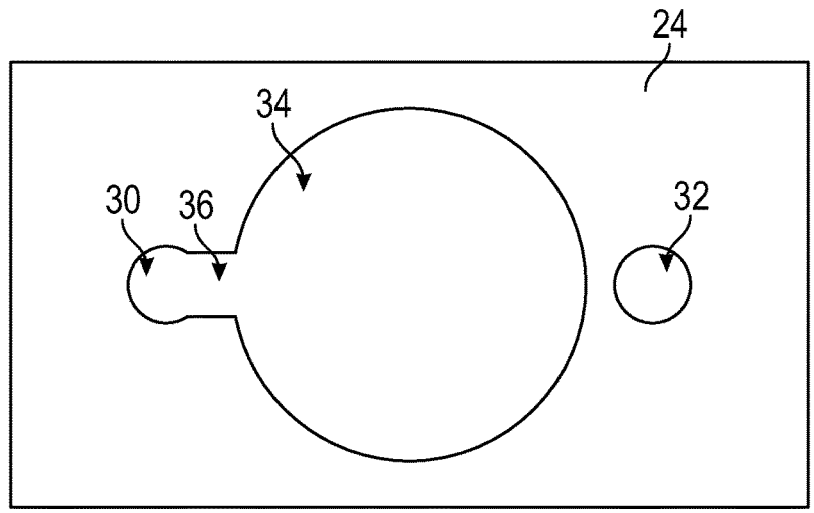
Figure 3C:
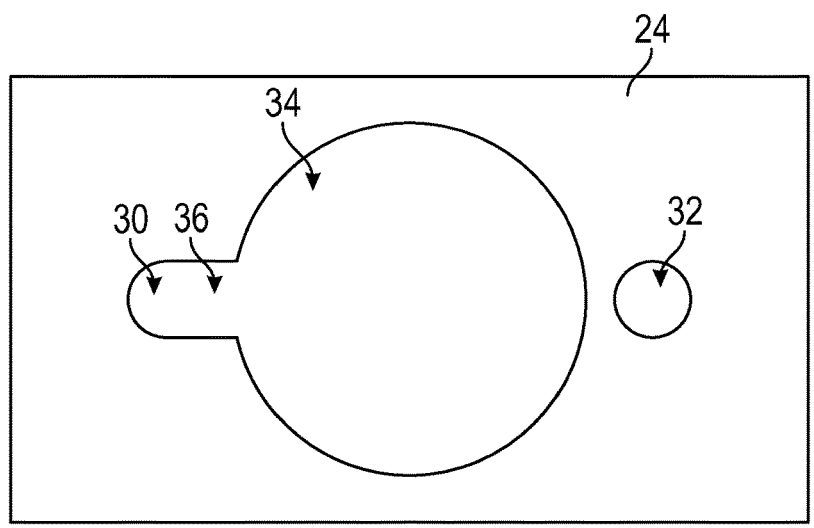

With reference to FIG. 3A, the plan view of the first manifold portion 24 further shows that the inlet 32 is fluidly separated from the first chamber 34 in the first manifold portion 24. The first chamber 34 is connected via the passage 36 to the channel 38. The inlets 30 and 32 may have a circular cross-section and may have a diameter from about 0.5 mm to about 2 mm. The diameter of the channel 38 may be the same as the width of the passage 36 as shown in FIG. 3C, e.g., about 1.2 mm, or may be different as shown in FIGS. 3A and 3B, in which the width of the passage 36 may be about 0.6 mm and 0.9 mm, respectively, whereas the diameter of the channel 38 may be about 1.2 mm.

With continued reference to FIG. 2, the second manifold portion 26 of the manifold 22 defines a channel 40, which is fluidly coupled to the channel 38 of the second manifold portion 26. The channel 40 is interconnected with a second chamber 44 via a passage 46, both of which are also defined within the second manifold portion 26. The second chamber 44 is also interconnected to an inlet base 50 via a passage 48. The inlet base 50 is fluidly coupled to the inlet 32. The passages 46 and 48 may have the same dimensions as the passage 36. In embodiments, the passage 48 may be longer than either of the passages 36 and 46.

The second manifold portion 26 and the first manifold portion 24 are separated by the flexible membrane 28, which includes a channel opening 52 aligned with the channels 38 and 40, thereby forming a single channel, and an inlet opening 54 aligned with the inlet 32 and the inlet base 50, thereby forming a single inlet. The flexible membrane 28 includes a deflection portion 29 separating the first chamber 34 and the second chamber 44 preventing flow of media (e.g., liquid or gas) directly therebetween other than through the channels 38 and 40 and the passages 36 and 46.

Figure 4A:
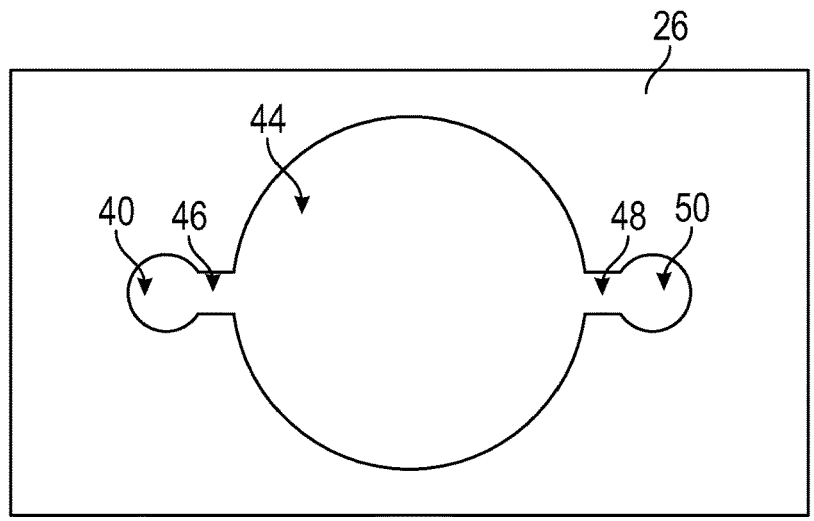
FIG. 4A-C are plan views of a base manifold of the passive microfluidic valve of FIG. 2 according to according to one embodiment of the present disclosure.
Figure 4B:
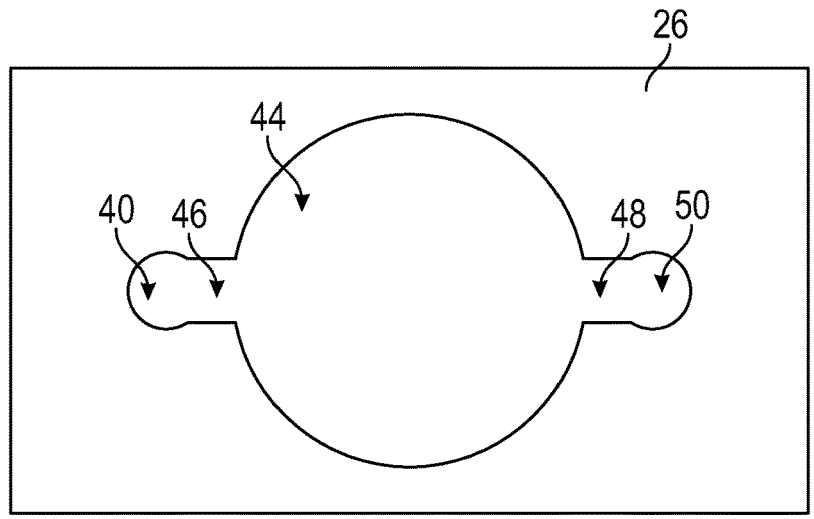
Figure 4C:
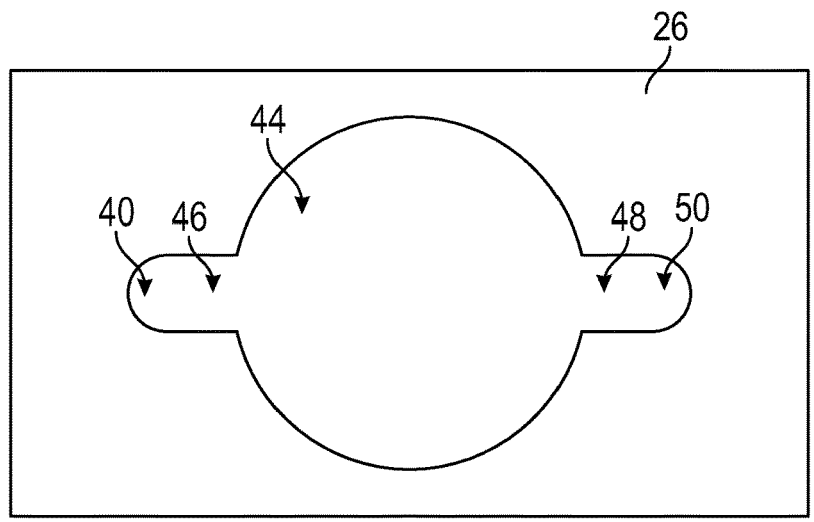

With reference to FIG. 4A, the plan view of the second chamber 44 shows that the inlet base 50 is fluidly coupled to the second chamber 44 via the passage 48. The second chamber 44, is in turn, connected via the passage 46 to the channel 40. The channel 40, the second chamber 44, the inlet base 50 have the same diameters as the counterpart channel 38, the first chamber 34, and the inlet 32. The diameters of the channel 40 and the inlet base 50 may be the same as the width of the passages 46 and 48 as shown in FIG. 4C, e.g., about 1.2 mm, or may be different as shown in FIGS. 4A and 4B, in which the width of the passages 46 and 48 may be about 0.6 mm and 0.9 mm, respectively, whereas the diameter of the channel 40 and the inlet base 50 may be about 1.2 mm.

The second manifold portion 26 and the first manifold portion 24 may be formed using any suitable techniques depending on the material being used. The second manifold portion 26 and the first manifold portion 24 may be formed from elastomers, such as polydimethylsiloxane, thermoplastics, such as acrylonitrile butadiene styrene, polylactic acid, polycarbonate, polypropylene, acrylic styrene acrylonitrile, metals, ceramics, and combinations thereof. The second manifold portion 26 and the first manifold portion 24 may be fabricated using soft lithography, computer numerical control (CNC) machining, laser cut stacked fabricating, additive manufacturing (e.g., 3D printing), and the like. The flexible membrane 28 may be formed from an elastomer, such as polydimethylsiloxane, and may be fabricated using spin coating, drop casting, solution casting, electrospinning, and the like.

When using soft lithography techniques to fabricate the first manifold portion 24 and the second manifold portion 26, initially a photolithography mask for each of the first manifold portion 24 and the second manifold portion 26 is formed using the outlines of FIGS. 3A-C and FIGS. 4A-C. The first manifold portion 24 and the second manifold portion 26 may be formed using a wafer-based mold and the flexible membrane 28 may be formed by spin-coating or another suitable technique. All of the components, the first manifold portion 24, the second manifold portion 26, and the flexible membrane 28 are aligned, with the flexible membrane 28 being disposed between the first manifold portion 24 and the second manifold portion 26 and are secured to each other using plasma bonding, adhesives or other suitable techniques. Thereafter, the channel opening 52 aligned with the channels 38 and 40 and the inlet opening 54 aligned with the inlet 32 and the inlet base 50 are formed by cutting or punching through the flexible membrane 28.

The valve 20 operates in a bidirectional manner as a normally open valve, thereby allowing for flow in either direction. The flow of media in a first direction is described in further detail below with respect to FIGS. 5 and 6 and denotes the flow from the inlet 30, through the first chamber 34, the channels 38 and 40, the second chamber 44 and out through the inlet 32. The flow of media in a second direction is described in further detail below with respect to FIGS. 7 and 8 and denotes the flow in an opposite direction to that of the first direction, namely, from the inlet 32, through the second chamber 44, the channels 40 and 38, through the first chamber 34, and out through the inlet 30.

Figure 5:
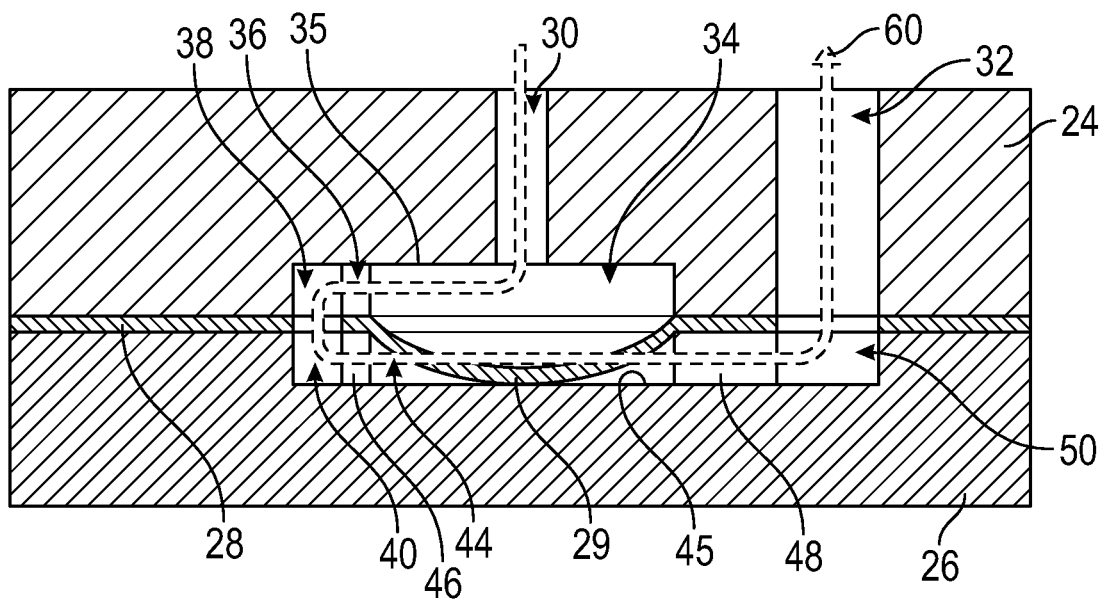
FIG. 5 is a side, cross-sectional view of the passive microfluidic valve of FIG. 2 in a partially open state according to one embodiment of the present disclosure.
Figure 6:
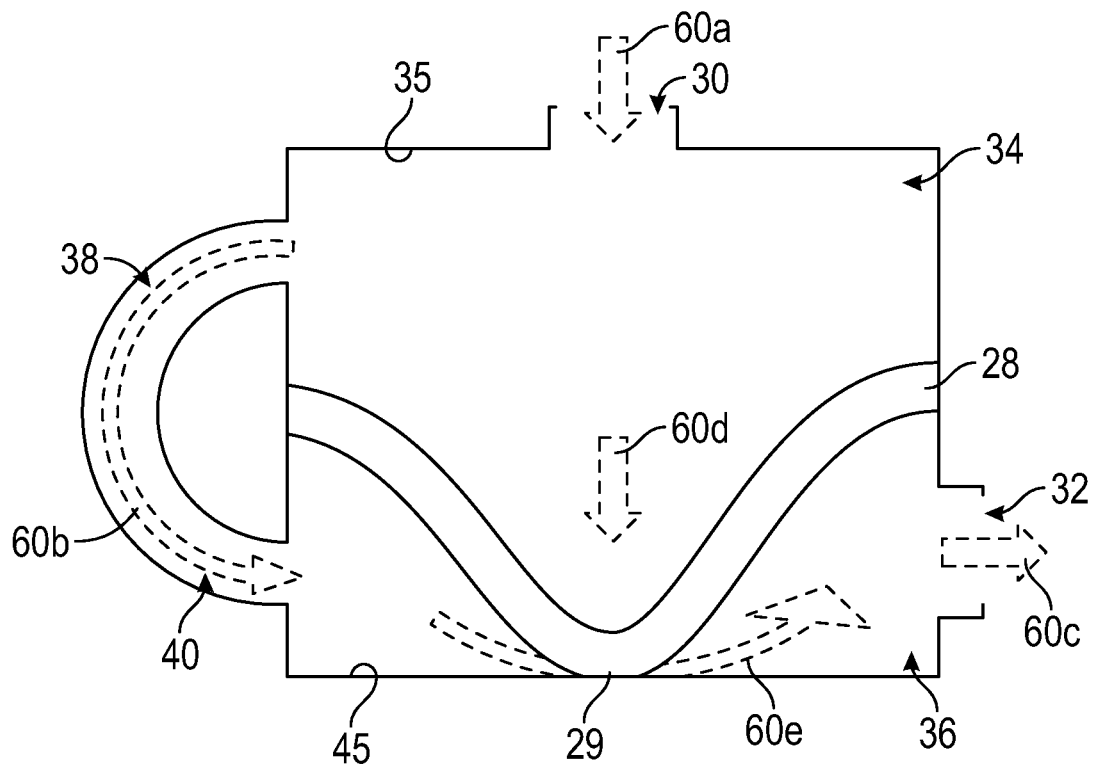
FIG. 6 is a side, schematic diagram of the passive microfluidic valve of FIG. 2 in the partially open state according to one embodiment of the present disclosure.

With reference to FIGS. 5 and 6, the valve 20 is capable of controlling flow in the first direction shown by an arrow 60 in FIG. 5. The media enters through inlet 30 into the first chamber 34 of the first manifold portion 24 as shown by an arrow 60a of FIG. 6. The media thereafter flows through the first chamber 34 to the second chamber 44 through the interconnected channels 38 and 40 as shown by an arrow 60b of FIG. 6, and subsequently exits through the inlet 32 as shown by an arrow 60c of FIG. 6.

When the flow of media is in the first direction, the valve 20 is always in an open state, e.g., either neutral state or partially open state, or any state therebetween. However, the flow rate may be limited by the deflection portion 29 being deflected into the second chamber 44 and partially occluding the second chamber 44. The flow rate is not shut off completely, since the deflection portion 29 allows for some media to flow around the deflection portion 29. The flexible membrane 28, and in particular, the deflection portion 29 is deflected upon the pressure of the media flow rising above a predetermined pressure threshold. With reference to FIG. 2, the valve 20 is in a neutral state, in which the flow may be in either first or second direction. In response to increased pressure, i.e., surpassing the pressure threshold, the deflection portion 29 of the flexible membrane 28 deflects toward an inner surface 45 of the second chamber 44. The pressure threshold depends on the flexibility of the flexible membrane 28. Thus, the degree of deflection of the deflection portion 29 toward the inner surface 45 of the second chamber 44 increases with the pressure of the flow as represented by an arrow 60d of FIG. 6. The amount of deflection limits the flow rate of the media in the first direction is modulated in response to pressure. Thus, and as pressure increases the flow rate is limited accordingly.

The degree of deflection of the flexible membrane 28 restricts the flow through the second chamber 44 since the deflection portion 29 partially blocks the second chamber 44. In embodiments, the deflection of the deflection portion 29 may be such that the deflection portion 29 contacts the inner surface 45 as shown in FIGS. 5 and 6, which further limits the flow rate. Thus, rather than flowing directly through the second chamber 44, the media flows, as shown by an arrow 60e, around the deflection portion 29 that is in contact with the inner surface 45, thereby further limiting the flow rate. In embodiments, the pressure threshold in the first direction which results in deflecting the deflection portion 29 to contact the inner surface 45 may be from about 1 pound per square inch (PSI) to about 2 PSI.

Figure 7:
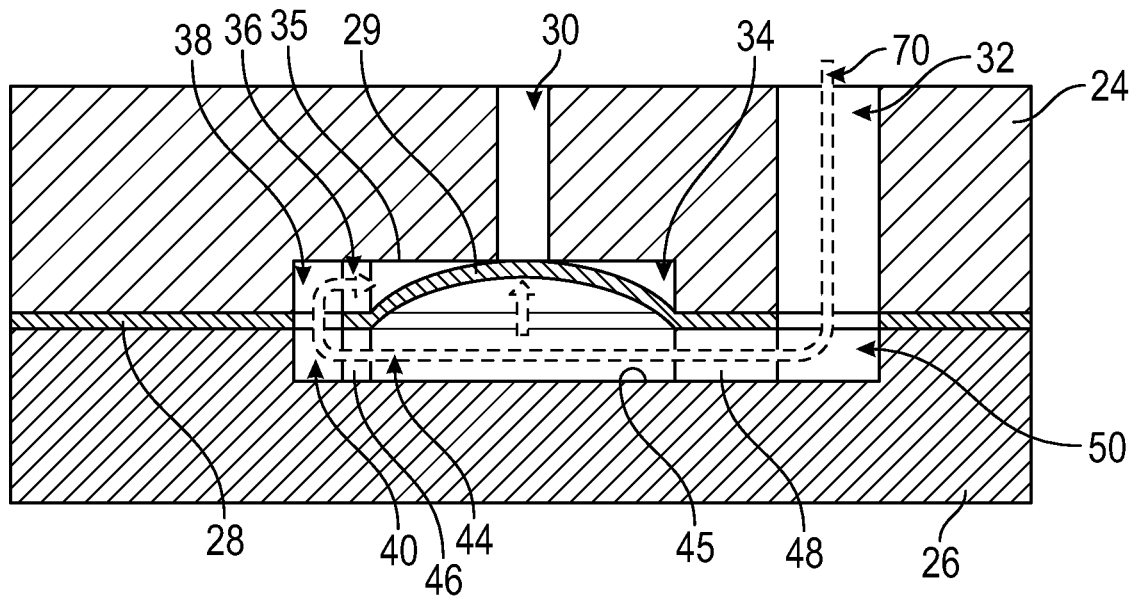
FIG. 7 is a side, cross-sectional view of the passive microfluidic valve of FIG. 2 in a closed state according to one embodiment of the present disclosure.
Figure 8:
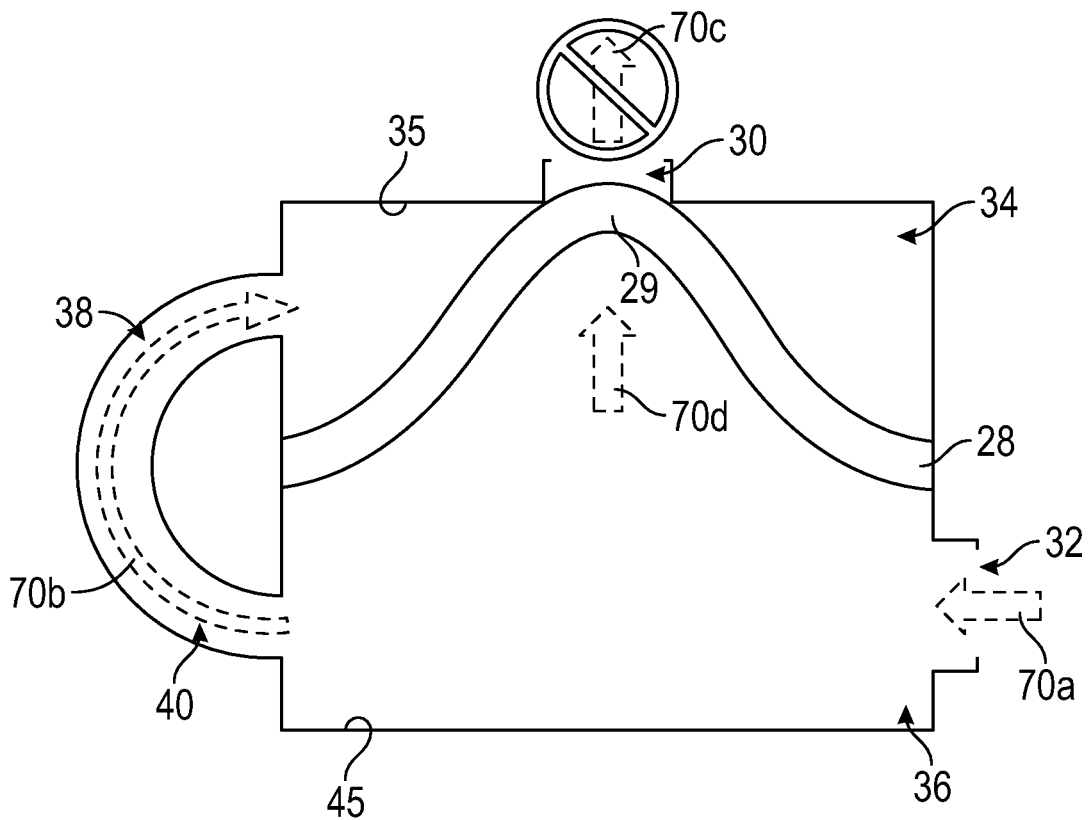
FIG. 8 is a side, schematic diagram of the passive microfluidic valve of FIG. 2 in the closed state according to one embodiment of the present disclosure.

With reference to FIGS. 7 and 8, the valve 20 is also capable of controlling flow in the second direction as shown by an arrow 70 in FIG. 7, including completely shutting off flow upon reaching a pressure threshold. The media enters through inlet 32 into the second chamber 44 of the second manifold portion 24 as shown by an arrow 70a of FIG. 8. The media thereafter flows through the second chamber 44 into the first chamber 34 through the interconnected channels 38 and 40 as shown by an arrow 70b of FIG. 8, and subsequently exits through the inlet 32 as shown by an arrow 70c of FIG. 8.

The flow of media in the second direction is only open until the pressure threshold is reached, at which point the deflection portion 29 of the flexible membrane 28 blocks or otherwise closes off the inlet 30. The deflection portion 29 remains in the closed state until the pressure is lowered. The flexible membrane 28, and in particular, the deflection portion 29 is deflected upon the pressure of the media flow passing a predetermined pressure threshold. In response to increased pressure, i.e., surpassing the pressure threshold, the deflection portion 29 of the flexible membrane 28 deflects toward an inner surface 35 of the first chamber 34. The pressure threshold depends on the flexibility of the flexible membrane 28. Thus, the degree of deflection of the deflection portion 29 toward the inner surface 35 of the first chamber 34 increases with the pressure of the flow as represented by an arrow 70d of FIG. 7.

The degree of deflection of the flexible membrane 28 restricts the flow through the first chamber 34 since the deflection portion 29 partially blocks the first chamber 34. In embodiments, the deflection of the deflection portion 29 may be such that the deflection portion 29 contacts the inner surface 35 as shown in FIGS. 7 and 8, which completely blocks the inlet 30, preventing any media flow therethrough. In further embodiments, the pressure threshold in the second direction which results in deflecting the deflection portion 29 to contact the inner surface 45 may be the same as the pressure threshold which results in deflecting the deflection portion 29 in the first direction and may be from about 1 pound per square inch (PSI) to about 2 PSI.

Figure 9A:
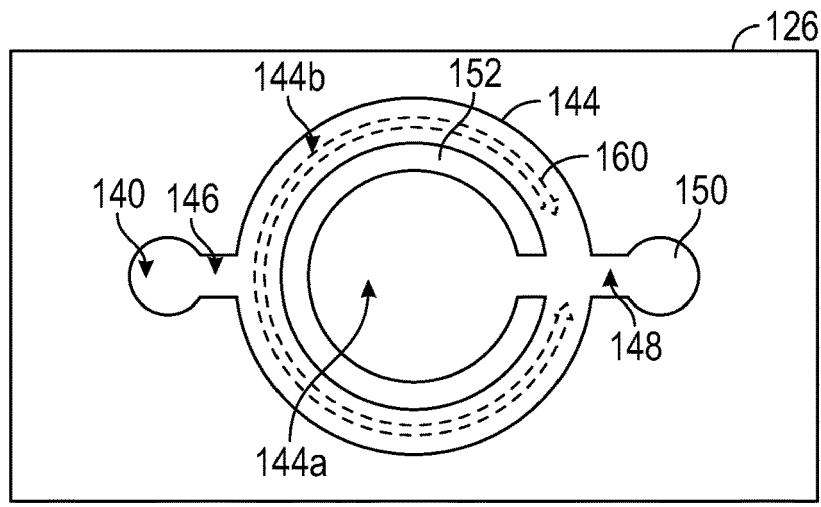
FIG. 9A-C are top views of a base manifold of a passive microfluidic valve according to another embodiment of the present disclosure.
Figure 9B:
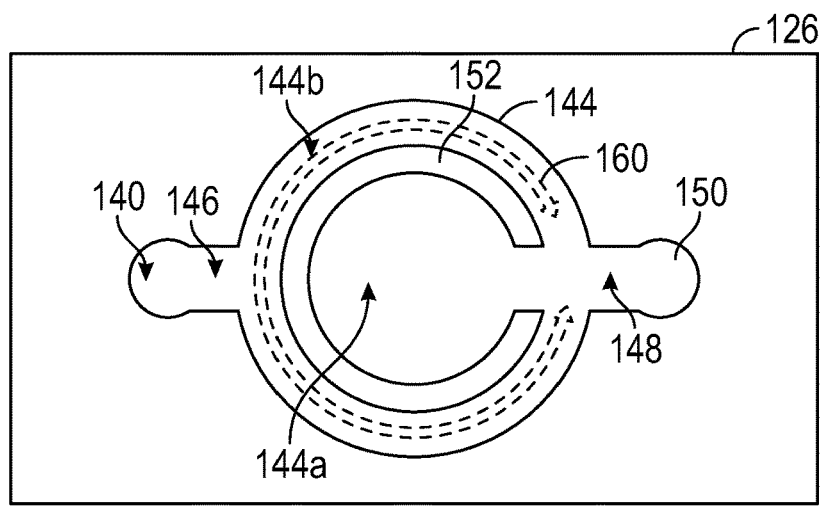
Figure 9C:
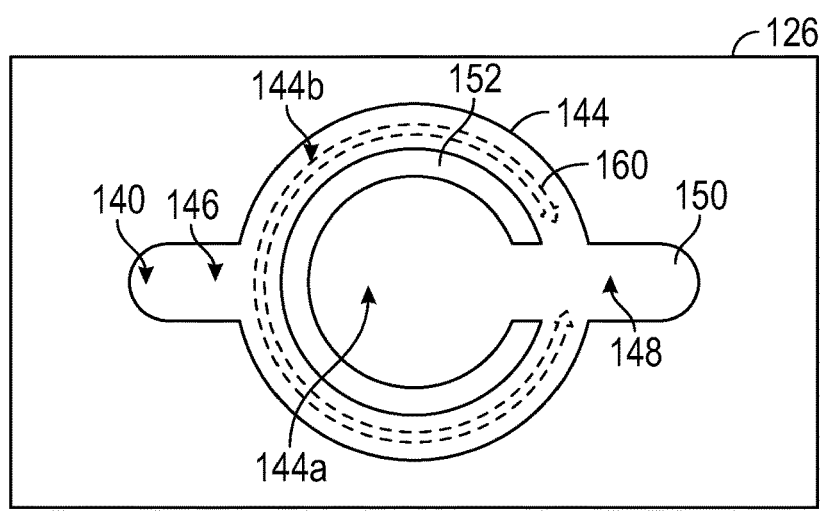

With reference to FIGS. 9A-C, another embodiment of a second manifold portion 126 is shown and only difference with the second manifold portion 26 are described, like reference numerals designate identical or corresponding elements. With reference to FIG. 9A, the plan view of a second chamber 144 shows an inlet base 150 that is fluidly coupled to the second chamber 144 via a passage 148. The second chamber 144, is in turn, connected via a passage 146 to a channel 140. The channel 140, the second chamber 144, and the inlet base 150 have the same diameters as the channel 40, the second chamber 44, and the inlet base 50, respectively, and function similarly. The diameters of the channel 140 and the inlet base 150 may be the same as the width of the passages 46 and 48 as shown in FIG. 9C, e.g., about 1.2 mm, or may be different as shown in FIGS. 9A and 9B, in which the width of the passages 146 and 148 may be about 0.6 mm and 0.9 mm, respectively, whereas the diameter of the channel 140 and the inlet base 150 may be about 1.2 mm.

As shown in FIGS. 9A-C, the second manifold portion 126 also includes a partition 152, separating the second chamber 144 into an inner chamber 144a and an outer chamber 144b. The inner chamber 144a may have a diameter from about 2 mm to about 4 mm and the outer chamber may have a diameter from about 5 mm to about 10 mm. The second manifold portion 126 allows the valve 20 to function in the similar manner as with the second manifold portion 26, namely, when the flow is in the first direction, the valve 20 is always in an open state (e.g., neutral or partially open) and when the flow is in the second direction, the valve 20 is configured to close the inlet 30 in response to pressure rising above a threshold pressure.

The flexible membrane 28 also functions similarly as described above with respect to FIGS. 5-8, however, the partition 152 limits the amount of deflection of the deflection portion 29 into the second chamber 144. The partition 152 acts as a support, preventing the deflection portion 29 closing off any portion of the outer chamber 144b. This allows the outer chamber 144b to always provide a consistent flow rate, regardless of the pressure supplied when the flow is in the first direction. Rather than flowing directly through the second chamber 144, the media flows around the partition 152 as shown by an arrow 160, thereby limiting the flow rate. The dimensions, e.g., diameter of the inner chamber 144a and the outer chamber 144b may be tailored to provide for a minimum flow rate, regardless of the pressure by, establishing a minimum passage width around the partition 152.

The partition 152 has no material effect on the functionality of the deflection portion 29 of the flexible membrane 28 in the second direction. Once the pressure in the second direction is above the pressure threshold, the deflection portion 29 blocks the inlet 30 of the first manifold portion 24 in the same manner as described above in FIGS. 7 and 8.

The valve 20 may be used as an exhaust and an air intake valve. As described above, the valve 20 is configured to be in an open state when the flow is in the first direction while providing modulation of the flow rate in response to changes in pressure. The valve 20 is also configured to completely close when the flow is in the second direction and the pressure increases above the pressure threshold, which depends on the flexibility of the membrane 28.

With reference to FIG. 1, the inlet 32 may be connected to the exhaust port of the micro-engine 12 and the inlet 30 may be connected to an air or oxygen supply source. The valve 20 is configured to close from high combustion pressure and reopen after combustion. In other words, during ignition and combustion of fuel, high combustion pressures are generated, and the valve 20 is closed to ensure that the micro-engine 12 generates mechanical power. Thereafter, as the combustion pressures decreases, the valve 20 opens allowing the combustion gases to flow through the valve 20 in the second direction. During induction, air is flowing through the valve 20 in the first direction into the micro-engine 12 until the pressure increases to decrease the flow rate due to deflection of the flexible membrane 28. Thereafter, the fuel/air mixture is ignited, and the process is repeated.

It will be appreciated that of the above-disclosed and other features and functions, or alternatives thereof, may be desirably combined into many other different systems or applications. Various presently unforeseen or unanticipated alternatives, modifications, variations or improvements may be subsequently made by those skilled in the art which are also intended to be encompassed by the following claims. Unless specifically recited in a claim, steps or components of claims should not be implied or imported from the specification or any other claims as to any particular order, number, position, size, shape, angle, or material.

What is claimed is:

1. A passive microfluidic valve comprising:
   a first manifold portion including:
      a first chamber;
      a first inlet fluidly coupled to the first chamber; and
      a second inlet;
   a second manifold portion in fluid communication with the first chamber via a channel, the second manifold portion including a second chamber fluidly coupled to the first chamber and the second inlet; and
   a flexible membrane disposed between the first manifold portion and the second manifold portion and separating the first chamber and the second chamber, the flexible membrane configured to modulate a flow rate of a media flowing between the first inlet and the second inlet in either direction in response to pressure of the media flow.

2. The passive microfluidic valve according to claim 1, wherein the flexible membrane includes a deflection portion separating the first chamber and the second chamber.

3. The passive microfluidic valve according to claim 2, wherein the deflection portion is configured to limit the flow rate of the media in a first direction, in which the media flows from the first inlet to the second inlet, in response to pressure of the media flow.

4. The passive microfluidic valve according to claim 3, wherein the deflection portion is further configured to deflect toward an inner surface of the second chamber while the media flow is in the first direction and partially occluding the second chamber.

5. The passive microfluidic valve according to claim 3, wherein the deflection portion is further configured to at least one of limit the flow rate of the media flow or block flow of the media in a second direction, in which the media flows from the second inlet to the first inlet, in response to pressure of the media flow.

6. The passive microfluidic valve according to claim 5, wherein the deflection portion is further configured to deflect toward an inner surface of the first chamber while the media flow is in the second direction and at least one of partially occluding the second chamber or blocking the first inlet.

7. The passive microfluidic valve according to claim 1, wherein each of the first manifold portion, the second manifold portion, and the flexible membrane is formed from an elastomer.

8. The passive microfluidic valve according to claim 7, wherein each of the first manifold portion, the second manifold portion, and the flexible membrane is formed from polydimethylsiloxane.

9. The passive microfluidic valve according to claim 1, wherein each of the first chamber and the second chamber has a substantially cylindrical shape having a diameter from about 3 mm to about 10 mm.

10. The passive microfluidic valve according to claim 1, wherein each of the first inlet and the second inlet has a circular cross-section having a diameter from about 0.5 mm to about 2 mm.

11. A passive microfluidic valve comprising:
    a first manifold portion including:
       a first chamber;
       a first inlet fluidly coupled to the first chamber; and
       a second inlet;
    a second manifold portion in fluid communication with the first chamber via a channel, the second manifold portion including a second chamber fluidly coupled to the first chamber and the second inlet; and
    a flexible membrane disposed between the first manifold portion and the second manifold portion and separating the first chamber and the second chamber, the flexible membrane configured to:
       limit a flow rate of a media flow in a first direction, in which media flows from the first inlet to the second inlet, in response to pressure of the media flow; and
       at least one of limit the flow rate of the media or block flow of the media in a second direction, in which the media flows from the second inlet to the first inlet, in response to pressure of the media flow.

12. The passive microfluidic valve according to claim 11, wherein the flexible membrane includes a deflection portion separating the first chamber and the second chamber.

13. The passive microfluidic valve according to claim 12, wherein the deflection portion is configured to deflect toward an inner surface of the second chamber while the media flow is in the first direction and partially occluding the second chamber.

14. The passive microfluidic valve according to claim 13, wherein the deflection portion is further configured to deflect toward an inner surface of the first chamber while the media flow is in the second direction and at least one of partially occluding the second chamber or blocking the first inlet.

15. The passive microfluidic valve according to claim 11, wherein each of the first manifold portion, the second manifold portion, and the flexible membrane is formed from an elastomer.

16. The passive microfluidic valve according to claim 15, wherein each of the first manifold portion, the second manifold portion, and the flexible membrane is formed from polydimethylsiloxane.

17. The passive microfluidic valve according to claim 11, wherein each of the first chamber and the second chamber has a substantially cylindrical shape having a diameter from about 3 mm to about 10 mm.

18. The passive microfluidic valve according to claim 11, wherein each of the first inlet and the second inlet has a circular cross-section having a diameter from about 0.5 mm to about 2 mm.

19. A micro-engine configured to combust fuel coupled to the passive microfluidic valve according to claim 11, wherein the passive microfluidic valve is configured to pass air in the first direction to the micro-engine and to pass exhaust in the second direction from the micro-engine.

* * * * *